(12) United States Patent
Imai

(10) Patent No.: US 6,774,404 B2
(45) Date of Patent: Aug. 10, 2004

(54) LIGHT EMITTING DIODE

(75) Inventor: Sadato Imai, Yamanashi (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 0 days.

(21) Appl. No.: 10/407,249

(22) Filed: Apr. 7, 2003

(65) Prior Publication Data

US 2003/0189217 A1 Oct. 9, 2003

(30) Foreign Application Priority Data

Apr. 5, 2002 (JP) .................................... P2002-103237

(51) Int. Cl.[7] ............................................. H01L 33/00
(52) U.S. Cl. ...................................... 257/98; 257/100
(58) Field of Search ............................ 257/89, 98, 99, 257/301, 100

(56) References Cited

U.S. PATENT DOCUMENTS 6,294,800 B1 * 9/2001 Duggal et al. ................ 257/89
6,613,247 B1 * 9/2003 Hohn et al. ............ 252/301.36

OTHER PUBLICATIONS

M. Yoshio et al; Patent Abstracts of Japan; Publication No. JP 2000–124507; "Surface–Mounted Light–Emitting Diode"; 2000.

* cited by examiner

Primary Examiner—Hong Pham
Assistant Examiner—Hoa B. Trinh
(74) Attorney, Agent, or Firm—Browdy and Neimark, PLLC

(57) ABSTRACT

A light emitting diode is disclosed which can enhance the scattering of light produced by a light emitting element to improve a brightness not only at an upper surface but also at side surfaces of a resin sealant covering the light emitting element, thereby providing a high brightness level in a wider range of angle.

This light emitting diode comprises a substrate 22, a pair of electrodes 23a, 23b provided on the substrate, a light emitting element 24 mounted on the substrate and electrically connected to the electrodes, a sealant 26 provided on the substrate to seal the electrodes 23a, 23b and the light emitting element 24; and a light scattering layer 30 formed on an outermost layer of a light projecting surface 27 of the sealant 26.

8 Claims, 4 Drawing Sheets

LIGHT EMITTING DIODE

BACKGROUND OF THE INVENTION

1. Field of the Invention

The present invention relates to a light emitting diode and more particularly to a light emitting diode which enhances a scattering of light produced by a light emitting element to produce a uniform, bright illumination in a wide range of angle.

2. Description of the Prior Art

An example of a known conventional light emitting diode is shown in FIG. 1 (see Japanese Patent Disclosure No. 2000–124507). This light emitting diode 1 includes a substrate 2, a pair of electrodes 3a, 3b formed on both sides of the substrate 2, a light emitting element 4 disposed on the substrate 2, bonding wires 5 electrically connecting the light emitting element 4 to the paired electrodes 3a, 3b, and a resin sealant 6 provided on the substrate 2 to seal the light emitting element 4 and the bonding wires 5. Small light scattering particles 7 are dispersed in the entire resin sealant 6 to scatter light and thereby increase the brightness of light produced.

The light emitting diode 1 constructed as described above, however, has the following drawback. Since the light scattering particles 7 are dispersed uniformly in a whole interior of the resin sealant 6, an upper surface of the resin sealant 6 (light projecting surface 8) opposing a light emitting surface (upper surface) of the light emitting element 4 has an improved brightness because of the light scattering by the light scattering particles 7, whereas side surfaces 9 of the resin sealant 6 that do not face the light emitting surface of the light emitting element 4 have a small light scattering effect by the light scattering particles 7 and therefore a low brightness. It is therefore not possible to produce a uniform, bright illumination in a wide range of angle.

SUMMARY OF THE INVENTION

An object of the present invention is to provide a light emitting diode which can enhance the scattering of light produced by a light emitting element to improve a brightness not only at an upper surface but also at side surfaces of a sealant covering the light emitting element, thereby providing a high, uniform brightness in a wider range of angle.

To achieve the above objective, a light emitting diode of the present invention comprises: a substrate; a pair of electrodes provided on the substrate; a light emitting element mounted on the substrate and electrically connected to the electrodes; a sealant provided on the substrate to seal the electrodes and the light emitting element; and a light scattering layer formed on an outermost layer of at least one surface of the sealant.

Since the light scattering layer is formed on the outermost layer of the sealant as described above, the light produced by the light emitting element is greatly refracted by the light scattering layer and rays of light reflected back into the interior of the sealant are also scattered inside the sealant, resulting in an enhanced light scattering action. This improves the luminance level not only at the upper surface of the sealant but also at its side surfaces, thus producing a bright, uniform illumination in a wide range of angle.

In one embodiment, the sealant is formed of a resin material which is transparent or has a light permeability, and the light scattering layer is formed of a paint film having a large number of light scattering particles dispersed therein or of a sheet member having a large number of light scattering particles mixed therein. The paint film is formed on the surface of the sealant by printing, and the sheet member is formed on the surface of the sealant by bonding.

The light scattering particles dispersed in the light scattering layer are fine particles of silicon dioxide or titanium oxide. Any desired luminance level can be obtained by adjusting a diameter and an amount of fine particles to be dispersed according to the use of the light emitting diode.

The light scattering particles are projected from the surface of the light scattering layer to form many protrusions and recesses in the surface, i.e., roughen or undulate the surface, to further enhance the light scattering action.

Such a light scattering layer is formed, for example, on the light projecting surface of the sealant which opposes the light emitting surface of the light emitting element. With the light scattering layer provided on the light projecting surface of the sealant, the light emitted from the light emitting surface of the light emitting element can be effectively refracted and reflected, resulting in an enhanced scattering of light in a wide range of angle.

DESCRIPTION OF PREFERRED EMBODIMENTS

Now, light emitting diodes embodying the present invention will be described in detail by referring to the accompanying drawings.

Figure 1:
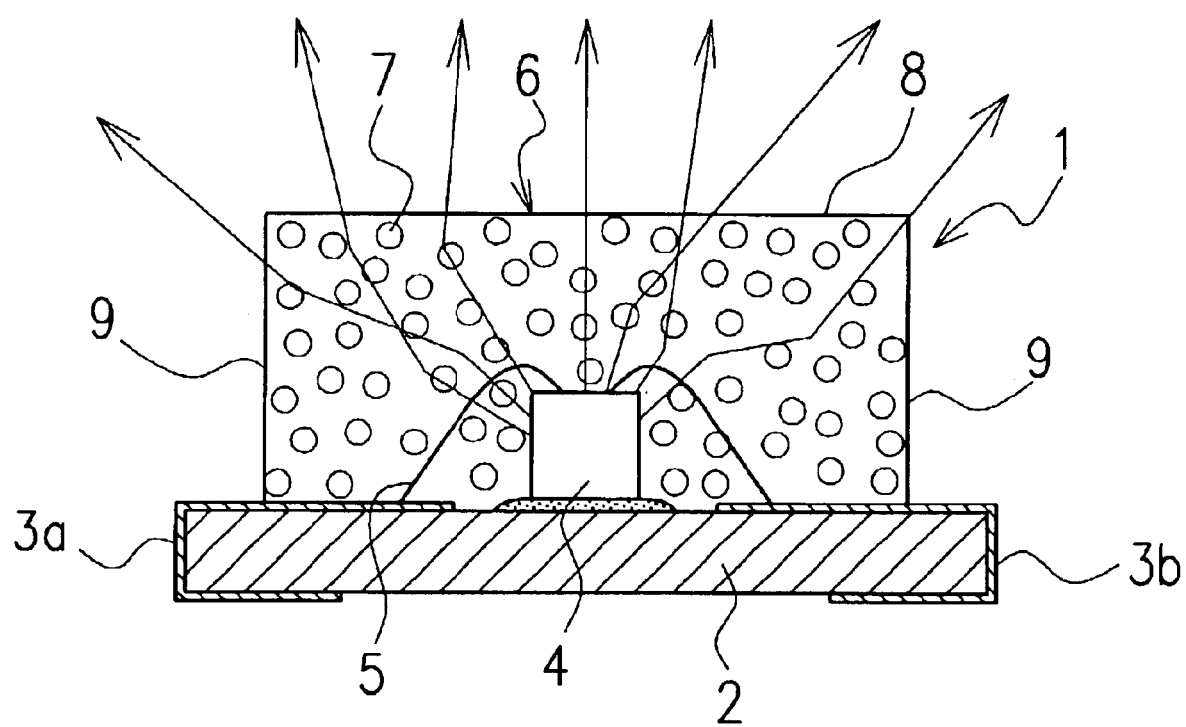
FIG. 1 is a cross-sectional view of a conventional light emitting diode showing how light is scattered.
Figure 2:
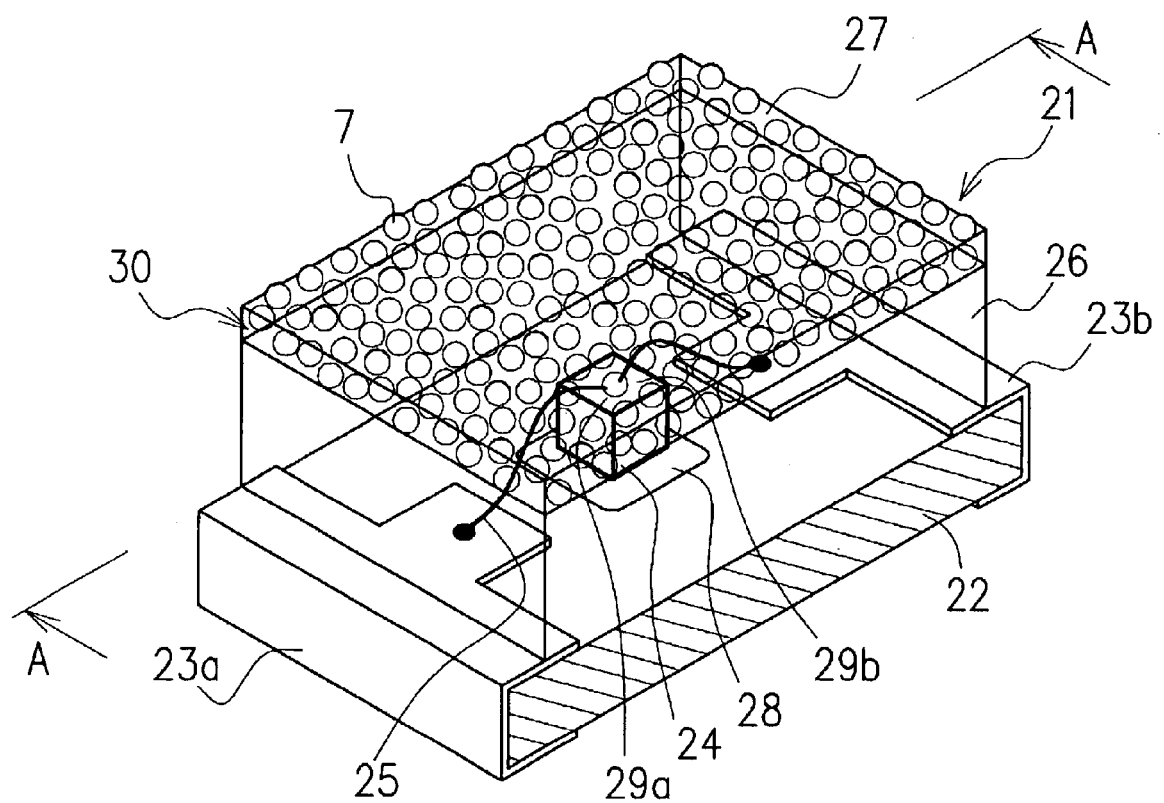
FIG. 2 is an overall perspective view of a light emitting diode of the present invention.
Figure 3:
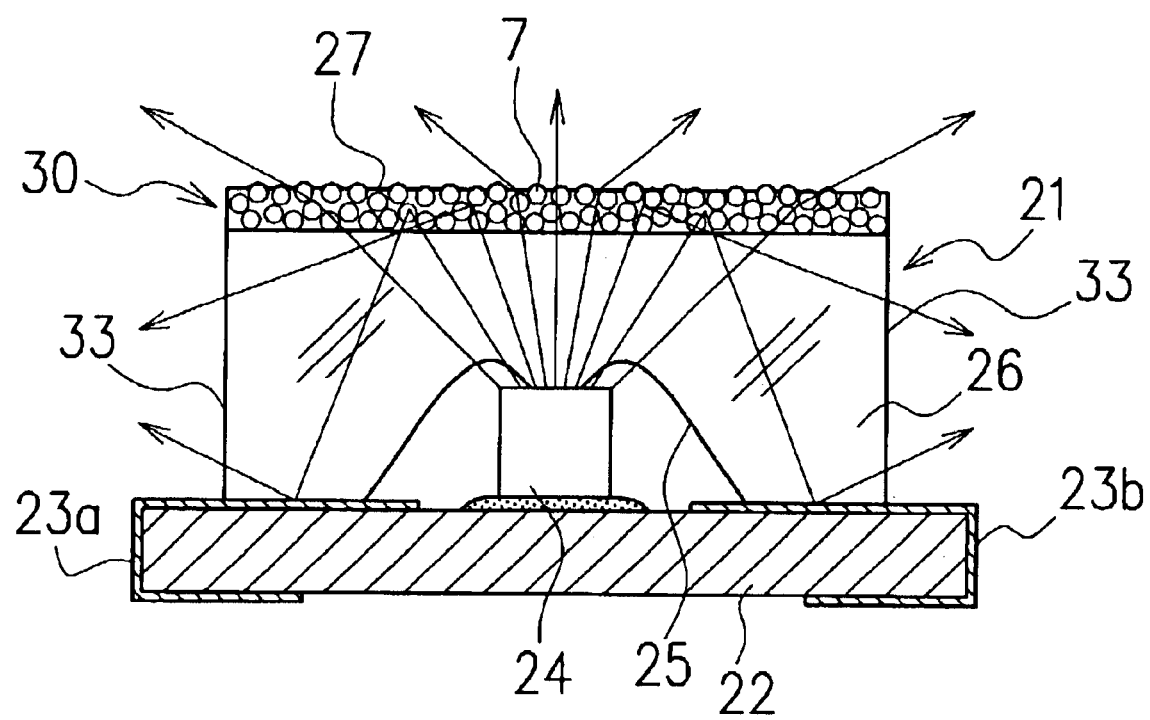
FIG. 3 is a cross-sectional view of the light emitting diode taken along the line A—A of FIG. 2.

FIG. 2 and FIG. 3 show one embodiment of a light emitting diode according to this invention. The light emitting diode 21 has a substrate 22 made of a glass epoxy resin or BT (Bismaleimide Triazine) resin, a pair of electrodes 23a, 23b attached to the substrate 22, a light emitting element 24 mounted on the substrate 22, bonding wires 25 for electrically connecting the light emitting element 24 to the electrodes 23a, 23b, a resin sealant 26 for sealing the light emitting element 24, the bonding wires 25 and also connecting portions between the electrodes 23a, 23b and the bonding wires 25, and a light scattering layer 30 formed on an outermost layer of the resin sealant 26.

The electrodes 23a, 23b may be mounted on an external substrate such as a mother board not shown.

The light emitting element 24 is formed of, for example, a small cubic silicon chip. The light emitting element 24 is bonded at its bottom to the substrate 22 by an insulating bonding agent 28. The light emitting element 24 has a pair of electrodes 29a, 29b (anode and cathode) formed at its top surface.

One of the bonding wires 25 is connected at one end to the element electrode 29a and at the other end to the electrode 23a on the substrate 22. The other bonding wire 25 has its one end connected to the element electrode 29b and the other end connected to the electrode 23b on the substrate.

The resin sealant 26 is an almost cuboid-shaped cover on the substrate 22 and centered at the light emitting element 24. The resin sealant 26 is formed of a transparent or milk white epoxy resin with a light permeability and can transmit light produced by the light emitting element 24. The resin sealant 26 is made by poring a resin material into a mold of a desired shape and then curing it.

The upper surface of the resin sealant 26 faces the light emitting surface (top surface) of the light emitting element 24 and functions as a light projecting surface 27. The light projecting surface 27 is formed with the light scattering layer 30 over its entire outermost layer. The light scattering layer 30 on the light projecting surface 27 has a predetermined thickness and contains a large number of uniformly dispersed light scattering particles 7.

As the light scattering particles 7 fine particles of materials with high reflectivity, such as silicon dioxide ($SiO_2$) and titanium dioxide ($TiO_2$), may be advantageously used. The size of individual light scattering particles 7, though not limited to any particular value, may preferably be set to about 1 $\mu$m in average diameter in terms of the reflection effect and the ease of handling.

A method of forming the light scattering layer 30 may, for example, involve printing the light projecting surface 27 of the resin sealant 26 with a paint, which has an appropriate amount of light scattering particles 7 dispersed evenly in a paint material, and then curing the printed layer. This method allows the light scattering layer 30 to be formed easily and its thickness to be adjusted with ease. The light scattering is determined by the diameter and the amount of light scattering particles 7 mixed in the paint material. That is, the light scattering action is enhanced by increasing the density of the mixed light scattering particles 7. However, too much of the light scattering particles 7 results in a reduction in transmissivity of the resin sealant 26 and thus an appropriate balance needs to be considered. The thickness of the light scattering layer 30 is determined by a thickness of the printed film. Though not limited to any particular value, the thickness of the light scattering layer 30 may preferably be set to 10–20% of the overall thickness of the resin sealant 26, in which case the light scattering is most effective.

The paint material may use an epoxy resin paint which is transparent or has a light permeability. When the light scattering layer 30 is printed as described above, the upper surface of the light scattering layer 30 is undulated by the protruding light scattering particles 7, as shown in FIG. 2 and FIG. 3. Hence, when the light emitted from the light emitting element 24 passes through the resin sealant 26 and goes out from the light projecting surface 27, it is greatly and randomly refracted and reflected at the undulated surface, further scattering the light and increasing the brightness.

Next, an illuminating action of the light emitting diode 21 of the above construction will be explained by referring to FIG. 3.

In this light emitting diode 21 the light emitting element 24 is excited to produce light when an electric current is applied to the electrodes 23a, 23b attached to the substrate 22. Most of the rays of light thus produced propagate towards the upper surface of the resin sealant 26, i.e., the light projecting surface 27 that opposes the light emitting surface (top surface) of the light emitting element 24, and is refracted or reflected by the light scattering layer 30 formed on the light projecting surface 27. The refracted or reflected rays are scattered to the outside of or reflected back into the inner side of the resin sealant 26. The rays that were reflected back into the inside of the resin sealant 26 are scattered therein until they go out of the resin sealant 26 mostly from side surfaces 33 thereof. Reflected rays also often go out from the side surfaces 33 of the resin sealant 26 after having further been reflected from the upper surface of the substrate 22. Since repetitive irregular reflections of light inside the resin sealant 26 or from the upper surface of the substrate 22, as described above, induce the scattering of light inside the resin sealant 26. This in turn increases the amount of light that is released from the side surfaces 33 of the resin sealant 26, improving the brightness at the side surfaces 33. At the same time, the amount of scattered rays coming out of the light projecting surface 27 of the resin sealant 26 also increases and thereby improves the brightness at the upper surface. As a result the brightness of the light emitting diode 21 as a whole improves and provides a uniform illumination in a wide range of angle.

Figure 4:
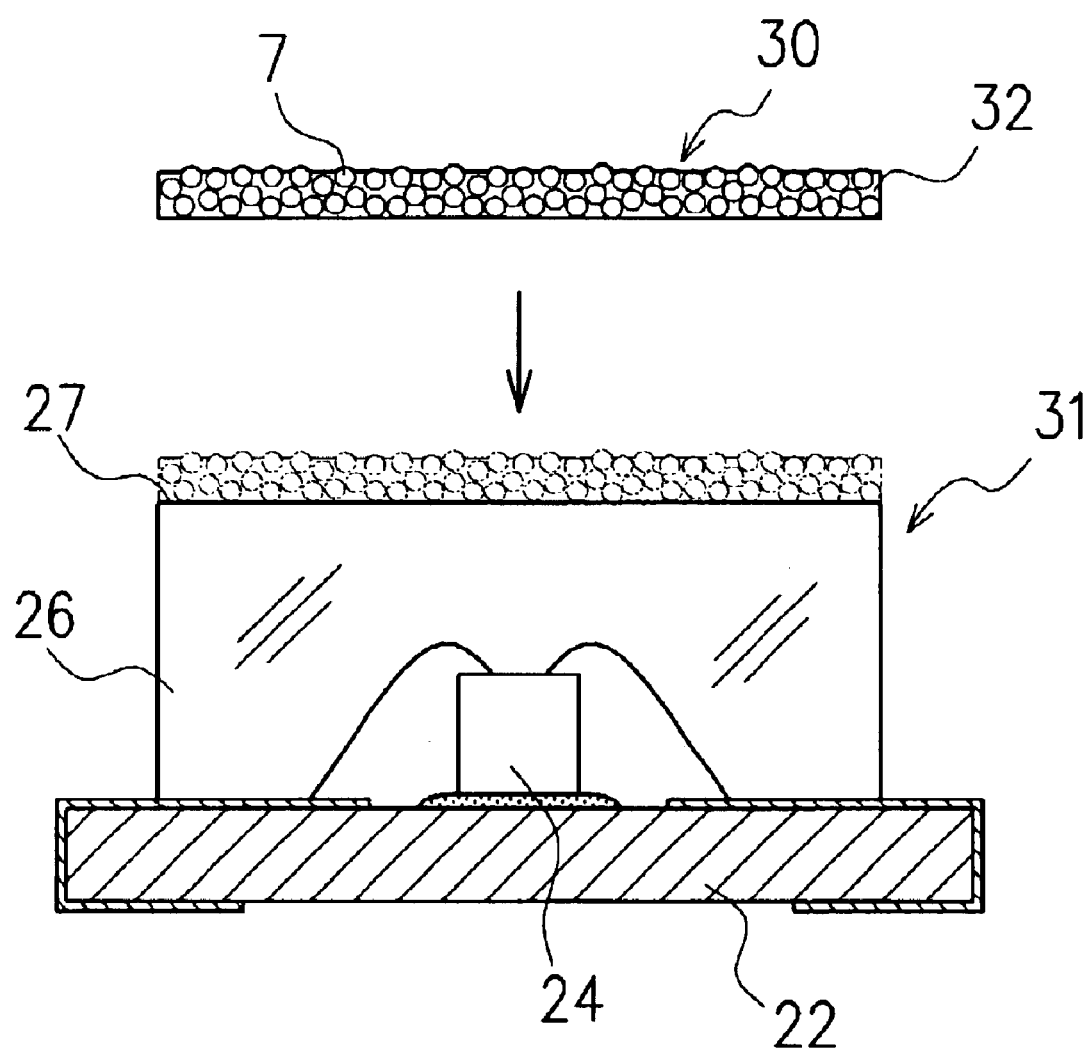
FIG. 4 is a cross-sectional view of a light emitting diode, another embodiment of this invention, which is similar to FIG. 3 but has a sheet member bonded to an upper surface of the resin sealant.

FIG. 4 shows an example construction in which the light scattering layer 30 is formed by bonding a sheet member 32. In a light emitting diode 31 of this embodiment, the sheet member 32 having the light scattering particles 7 mixed therein is bonded to the light projecting surface 27 of the resin sealant 26 that covers the light emitting element 24. The sheet member 32 is preferably formed of an epoxy resin which is transparent or has a light permeability, the same material as used for the resin sealant 26. The sheet member 32 is made by mixing an appropriate amount of fine particles of silicon dioxides ($SiO_2$) or titanium oxides ($TiO_2$) in a resin material. The light scattering action of the sheet member 32 varies depending on the thickness of the sheet and the content of the light scattering particles 7. The sheet thickness and the light scattering particle content can be set to a desired value.

The light scattering layer 30 may, for example, be formed easily by bonding, with a transparent adhesive, the underside of the sheet member 32 to the light projecting surface 27 of the resin sealant 26 provided on the substrate 22. As in the light scattering layer 30 shown in FIG. 2 and FIG. 3, the light scattering particles 7 may be projected slighted from the upper surface of the sheet member 32 to undulate the sheet surface, thus assuring an effective light scattering action.

There are other methods than those shown in FIG. 2 to FIG. 4. For example, a layer of the light scattering particles 7 may be laid on a bottom of a mold used to form the resin sealant 26 before molding. Molding the resin sealant 26 will automatically form the light scattering layer 30. The light emitting diode manufactured in this manner has the light scattering layer 30 integrally formed with the resin sealant 26, so that the light scattering layer 30 will not be peeled off or dislocated even if subjected to external impacts or temperature changes. It is therefore possible to maintain the quality of the light emitting diode for a long period of time.

While in the embodiments described above, the light scattering layer 30 has been shown to be provided on the light projecting surface 27, the upper surface of the resin sealant 26, it is also possible to provide the similar light scattering layer on the side surfaces of the resin sealant 26. Further, when the light projecting surface is located at the side surfaces of the resin sealant 26, the light scattering layer may be provided only to those side surfaces.

Further, the resin sealant 26 is not limited to a cuboid shape but may take any desired shape as long as it can cover the light emitting element 24 and its associated parts.

As described above, with the light emitting diode of this invention, since the light scattering layer is formed on the outermost layer of the resin sealant that seals the light emitting element, the light produced by the light emitting element is greatly refracted by the light scattering layer and diffused in a wide range of angle and at the same time rays reflected back into the interior of the resin sealant are scattered therein. These effective light scattering actions improve a brightness not only at the upper surface of the resin sealant but also at its side surfaces, which in turn improves an overall luminance level of the light emitting diode in a wide range of angle and makes the brightness uniform.

What is claimed is:

1. A light emitting diode comprising:
   a substrate;
   a pair of electrodes provided on the substrate;
   a light-emitting element mounted on the substrate and electrically connected to the electrodes and having a light-emitting surface;
   a sealant provided on the substrate to seal the electrodes and the light emitting element; and
   a light scattering layer formed on an outermost layer of the sealant opposite to the light-emitting surface of the light emitting element,
   the light scattering layer including a large number of light scattering particles dispersed therein, to scatter light emitted from the light-emitting element.

2. A light emitting diode according to claim 1, wherein the light scattering particles include fine particles of silicon dioxides or titanium oxides.

3. A light emitting diode according to claim 1, wherein the sealant is formed of a resin material which is transparent or has a light permeability.

4. A light emitting diode according to claim 1, wherein the light scattering layer is a paint film formed by printing on the surface of the sealant a paint mixed with light scattering particles.

5. A light emitting diode according to claim 1, wherein the light scattering layer is a sheet member bonded to the surface of the sealant and the sheet member has light scattering particles mixed therein.

6. A light emitting diode according to claim 1, wherein the light scattering layer has its surface roughened or undulated by a large number of protruding light scattering particles.

7. In a light emitting diode comprising a substrate; a pair of electrodes on said substrate; a light emitting element mounted on the substrate and electrically connected to the electrodes and having a light emitting surface facing in a first direction; and a transparent or light permeable sealant provided on the substrate sealing the electrodes and the light emitting element;

the improvement comprising a light scattering layer on a surface of said sealant facing in said first direction said light emitting surface of said light emitting element,
   the light scattering layer including a large number of light scattering particles dispersed therein relative to surfaces of said sealant facing in directions other than said first direction, to scatter light emitted from the light-emitting element.

8. In a light emitting diode comprising a substrate; a pair of electrodes on said substrate; a light emitting element mounted on the substrate and electrically connected to the electrodes and having a light emitting surface; and a transparent or light permeable sealant provided on the substrate sealing the electrodes and the light emitting element;

a light scattering layer formed on an outermost layer of the sealant opposite to the light-emitting surface of the light-emitting element, other surfaces of said sealant being substantially free of said light scattering layer,
   the light scattering layer including a large number of light scattering particles dispersed therein, to scatter light emitted from the light-emitting element.

* * * * *